United States Patent [19]

Murphy et al.

[11] Patent Number: 4,933,049
[45] Date of Patent: Jun. 12, 1990

[54] CRADLE FOR SUPPORTING PRINTED CIRCUIT BOARD BETWEEN PLATING MANIFOLDS

[75] Inventors: Timothy I. Murphy, Mahtomedi; James M. Fisher, Mound, both of Minn.

[73] Assignee: Unisys Corporation, Blue Bell, Pa.

[21] Appl. No.: 331,876

[22] Filed: Apr. 3, 1989

[51] Int. Cl.⁵ .................. C25D 5/02; C25D 5/08; C25D 17/06; B05C 3/04
[52] U.S. Cl. .................. 204/15; 204/24; 204/222; 204/224 R; 204/273; 204/225; 204/288; 204/279; 204/278; 204/297 R; 204/297 W; 118/428; 118/429; 118/500; 427/98; 427/443.1
[58] Field of Search .................. 118/429, 428, 500; 427/98, 443.1; 204/224 R, 222, 273, 275, 267, 279, 286–288, 197 R, 197 W, 225, 278

[56] References Cited

U.S. PATENT DOCUMENTS

| 3,091,217 | 5/1963 | Seymour | 118/428 X |
|---|---|---|---|
| 3,158,500 | 11/1964 | Sallo et al. | 427/443.1 |
| 3,522,165 | 7/1970 | Jones et al. | 204/267 X |
| 3,809,642 | 5/1974 | Bond et al. | 204/273 X |
| 3,895,137 | 7/1975 | Avramidis et al. | 427/295 X |
| 4,143,618 | 3/1979 | Del Vecchio | 118/429 X |
| 4,174,261 | 11/1979 | Pellegrino | 204/273 |
| 4,262,044 | 4/1981 | Kuczma, Jr. | 118/429 X |
| 4,478,882 | 10/1984 | Roberto | 427/97 |
| 4,500,394 | 2/1985 | Rizzo | 204/297 W X |
| 4,606,787 | 8/1986 | Pelligrino | 204/15 X |
| 4,622,917 | 11/1986 | Schramm | 118/696 |
| 4,628,726 | 12/1986 | Heikkila et al. | 73/611 |
| 4,667,049 | 5/1987 | Heikkila et al. | 558/236 |
| 4,734,296 | 3/1988 | Schramm | 427/98 X |
| 4,752,371 | 6/1988 | Kriesel et al. | 204/297 W |
| 4,789,450 | 12/1988 | Paterson | 204/279 X |

Primary Examiner—Donald R. Valentine
Attorney, Agent, or Firm—Frederick W. Niebuhr; Gleen W. Bowen; Robert S. Bramson

[57] ABSTRACT

In a system for electroplating a printed circuit board in which multiple spray orifices are provided in arrays on opposite sides of the circuit board, and multiple vacuum orifices are interspersed symmetrically and midway between adjacent spray orifices, a mounting means is provided for rapid and accurate locating of the printed circuit board in two selectively offset alternative positions to facilitate forming an electroplated layer of uniform thickness. The printed circuit board is supported from an elongate copper bar, with two alignment members mounted to opposite ends of the bar. A pair of saddles are fixed with respect to the tank containing the electrolyte. Each of the saddles has two V-shaped mounting surfaces conforming to the alignment members for a nesting engagement. The mounting surfaces of each saddle are offset from one another a predetermined horizontal and vertical distance, whereby alternative nesting engagements of the alignment members and saddles support the circuit borad in alternative positions, respectively aligning particular circuit board surface areas with spray orifices, and then with vacuum orifices.

16 Claims, 3 Drawing Sheets

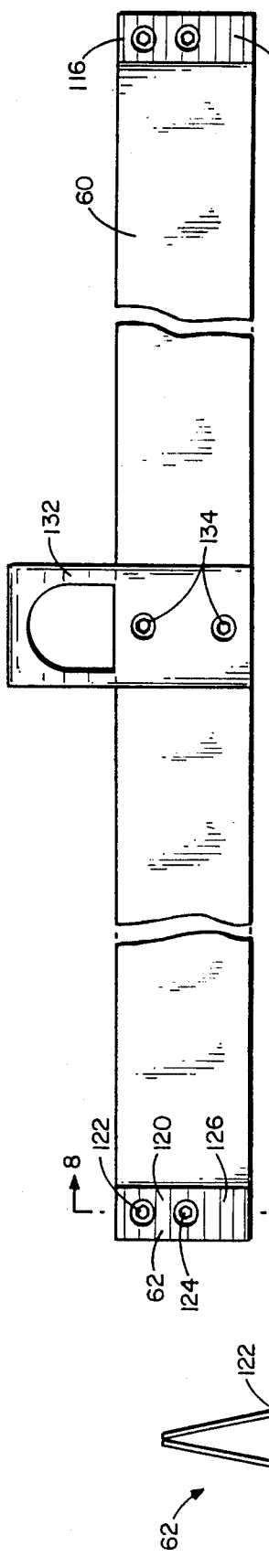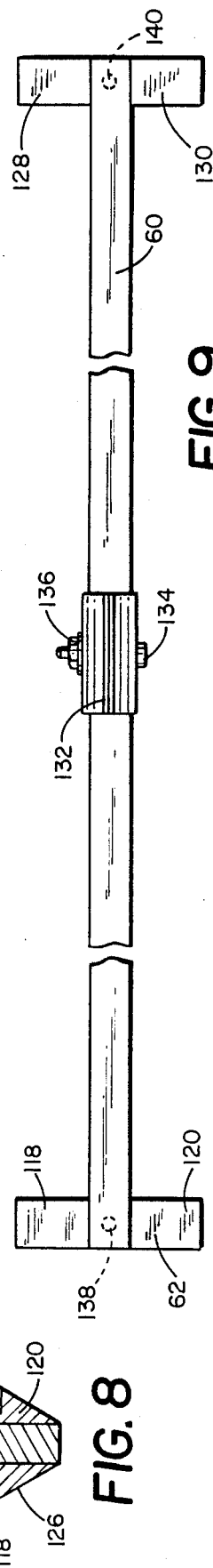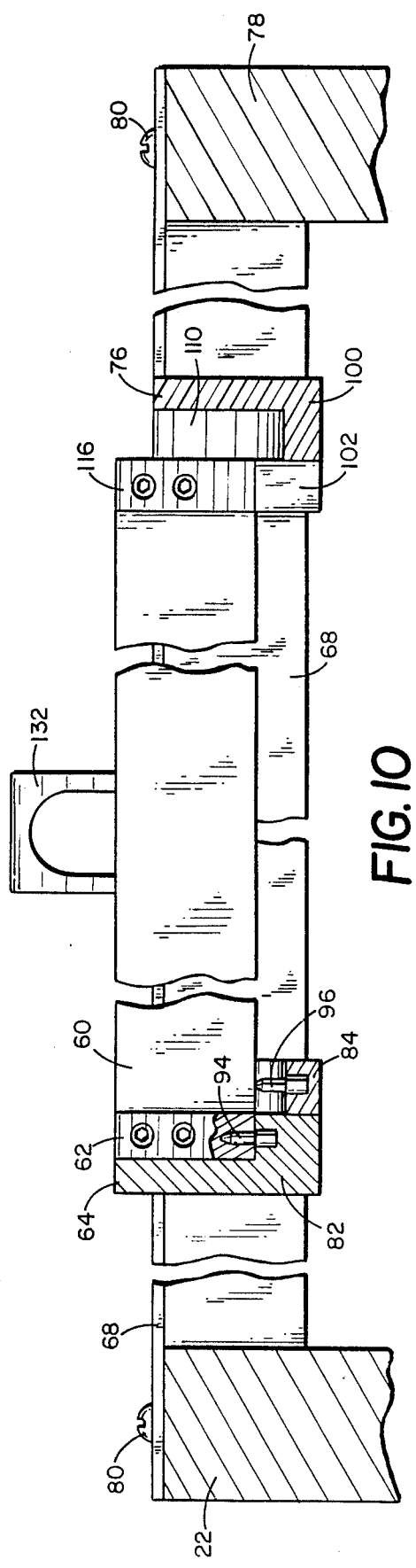

4,933,049

CRADLE FOR SUPPORTING PRINTED CIRCUIT BOARD BETWEEN PLATING MANIFOLDS

BACKGROUND OF THE INVENTION

This relates to plating processes, and more particularly to means for supporting a printed circuit board immersed in a liquid plating solution between plating manifolds, for selective repositioning with respect to the manifolds to enhance plating uniformity.

Deposition of metallic layers upon printed circuit boards is well known and can be accomplished by electroplating or electroless plating techniques. Electroplating typically is accomplished in a tank containing an electrolyte rich in ions of a metal to be plated. An object to the plated is immersed in the electrolyte solution and electrically coupled as a cathode. An object of the plating metal also is immersed in the electrolyte and connected as an anode, to provide the ions. Electroless plating is accomplished by a chemical reduction of a metallic ion in an aqueous solution and subsequent deposition of the metal, without applying electricity.

Both electroplating and electroless plating processes are most readily employed with objects having relatively flat and smooth surfaces. Special approaches have been attempted to counter problems encountered in plating rough or irregular objects. For example, U.S. Pat. No. 4,262,044 (Kuczma) discloses an apparatus for the electroless nickel plating of particularly long bodies such as piping or tubing. The object to be plated is disposed vertically in a tall tank containing an electroless nickel solution. Within the tank is a fluid distribution system including a pump, filter, heat exchanger to heat the solution, and a sparger tube with outlets directed toward the body being plated. The distribution system is said to maintain a uniform temperature, concentration and pH of the solution throughout the tube, all for a more uniform plating.

Another approach to electroless plating is disclosed in U.S. Pat. No. 3,895,137 (Avramidis). An electroless nickel plating solution is heated to incipient boiling in order to agitate the solution. Further, air is evacuated from the plating tank in which a chain or similar article is immersed. This approach is designed to improve electroless plating action, particularly along closely spaced surfaces of the chain links.

One difficulty, encountered frequently in connection with the plating of printed circuit boards, arises in connection with depositing metal in through-holes. As the circuit boards have become more sophisticated, through-holes have become small, for example twenty thousandths of an inch in diameter, with a length equal to the printed circuit board thickness, for example 0.3 inches. A severe difficulty is presented in gaining access to interior walls forming the through-holes, whether with an electrolyte or an electroless solution. An added problem, encountered particularly in electroplating, is the nature of the electrical field surrounding a through-hole, i.e. strongest near the mouth or entry of the through-hole and diminishing along its length. The result is a correspondingly low plating rate along interior walls as compared to plating at the mouth of the hole and other areas of the circuit board being plated.

To cover through-holes by electroless plating, U.S. Pat. No. 4,622,917 (Schramm) discloses a tank in which a pair of inwardly facing parallel manifolds are immersed on opposite sides of a printed circuit board. The electroless plating solution is pumped through a nozzle matrix of one of the manifolds, and is simultaneously drawn away from the printed circuit board through a second matrix of nozzles in the opposite manifold. This creates a pressure differential across the circuit board, enhancing the overall plating rate and increasing uniformity of plating over the walls defining through-holes.

In connection with electroplating, U.S. Pat. No. 4,174,261 (Pellegrino) discloses supporting a plated article above the electrolyte surface as a cathode between two anode manifolds, each with an array of spray nozzles. A second array of suction openings is intermixed with each array of spray nozzles. Moreover, the opposing manifolds can be offset so that spray nozzles of one of them are aligned such that their centers of delivery are offset with respect to each other. This improves the plating of through-holes in printed circuit boards, as it allows the electrolyte to be forced through the holes due to the localized pressure differential in the area of each through-hole.

The plating of circuit boards using manifolds having multiple nozzle arrays has thus been found beneficial, particularly when pressure nozzles are interspersed with arrays of suction openings. This geometry, critical for through-hole plating, becomes a shortcoming in surface plating distribution. Along with improved plating rates and plating of through-holes, a continuing problem of such arrangements has been a lack of uniform thickness on the surface and in holes, over the plated layer. Agitation of the plating solution and oscillation of the printed circuit board or other object being plated have been attempted, yet these solutions are overly complex or otherwise unsatisfactory.

Therefore, it is an object of the present invention to improve plating uniformity in a system employing manifolds with arrays of pressure nozzles or orifices for directing plating solution toward a printed circuit board.

Another object is to overcome a plating rate differential, arising in multiple nozzle systems, between surface areas proximate the nozzles and voids between nozzles, without oscillating the object being plated.

Yet another object is to provide a reliable, low-cost means for selectively supporting a printed circuit board in a plurality of alternative positions with respect to multiple nozzle plating manifolds on opposite sides of the printed circuit board.

SUMMARY OF THE INVENTION

To achieve these and other objects, there is provided a system for plating a printed circuit board over a substantially planar surface thereof. The system includes a plating solution supply means adjacent the body for directing a liquid plating solution onto the planar surface in the form of a plurality of parallel and spaced apart longitudinal streams or jets. The jets form an array of rows and columns extended in first and second transverse directions. Adjacent columns, and adjacent rows, are spaced apart from one another transversely by a select amount.

A mounting means is provided for repeatedly and removably securing the printed circuit board with respect to the plating solution supply means at a predetermined longitudinal separation from the supply means. The mounting means further selectively and alternatively guides the circuit board into and maintains the circuit board in first and second positions transversely offset from one another by one-half of the selected amount (nozzle periodicity), in the first and second transverse directions.

The mounting means preferably includes an elongate, rigid and transversely directed bar, and means for suspending the printed circuit board from the bar in fixed relation thereto. First and second alignment members are connected integrally to the bar at opposite ends of the bar. These self-centering alignment members have respective first and second generally downwardly facing and inclined guide surfaces.

First and second mounting members are fixed with respect to the plating solution supply means, and are transversely spaced apart from one another a distance corresponding to the length of the bar, which preferably is an even multiple of the supply nozzle periodicity. The first mounting member has first and second generally upwardly facing inclined mounting surfaces, while the second mounting member has generally upwardly facing and inclined third and fourth mounting surfaces. Each of these mounting surfaces conforms to the shape of at least one of the guide surfaces for nesting engagement with the associated guide surface.

The second and fourth mounting surfaces are offset from the first and third support surfaces, respectively, by one-half of the selected amount or nozzle periodicity, and in both of said first and second transverse directions. The first and third mounting surfaces, and alternatively the second and fourth mounting surfaces, support the elongate bar by gravity, by virtue of the nesting engagement with the first and second guide surfaces, respectively.

One particularly effective design employs substantially identical V-shaped profiles for the alignment members and mounting members, with a handle or other support means centrally located on the elongate bar. This permits a simple and convenient arrangement for positioning and repositioning of particularly bulky or heavy printed circuit boards. In particular, after a suitable plating time in a first position, the circuit board is shifted transversely to one side and downward, whereupon plating continues. The circuit board then is lifted by the handle and rotated 180° on a vertical axis, with the guide members again placed upon the mounting members for further plating. After a designated time, the circuit board is shifted transversely once again for the final of four plating positions.

The guide members and mounting members cooperate to provide a convenient yet precise mounting means in which, following the prescribed transverse offset, all surface areas on the printed circuit board which had been aligned with pressure nozzles become aligned with points midway between adjacent pressure nozzles, i.e. aligned with vacuum ports if such ports are employed. Plating uniformity is substantially improved, despite the lack of any means for oscillating the printed circuit board during plating, although circular or random oscillation can be used to further improve uniformity. Thus is provided a simple and reliable means for achieving markedly improved surface plating distribution in combination with the arrays of pressure nozzles and vacuum orifices particularly beneficial in plating the through-holes of the printed circuit boards.

IN THE DRAWINGS

For a better appreciation of the above and other features and advantages, reference is made to the following detailed description and the drawings, in which:

FIG. 7 is a side elevation of a portion of the support arrangement complementary to that portion shown in FIGS. 3 and 4;

FIG. 8 is a sectional view taken along the line 8—8 in FIG. 7;

FIG. 9 is a top plan view of the complementary portion of the support arrangement; and FIG. 10 is a sectional view taken along the line 10—10 in FIG. 3, illustrating the full support arrangement.

DETAILED DESCRIPTION OF THE PREFERRED EMBODIMENT

Figure 1:
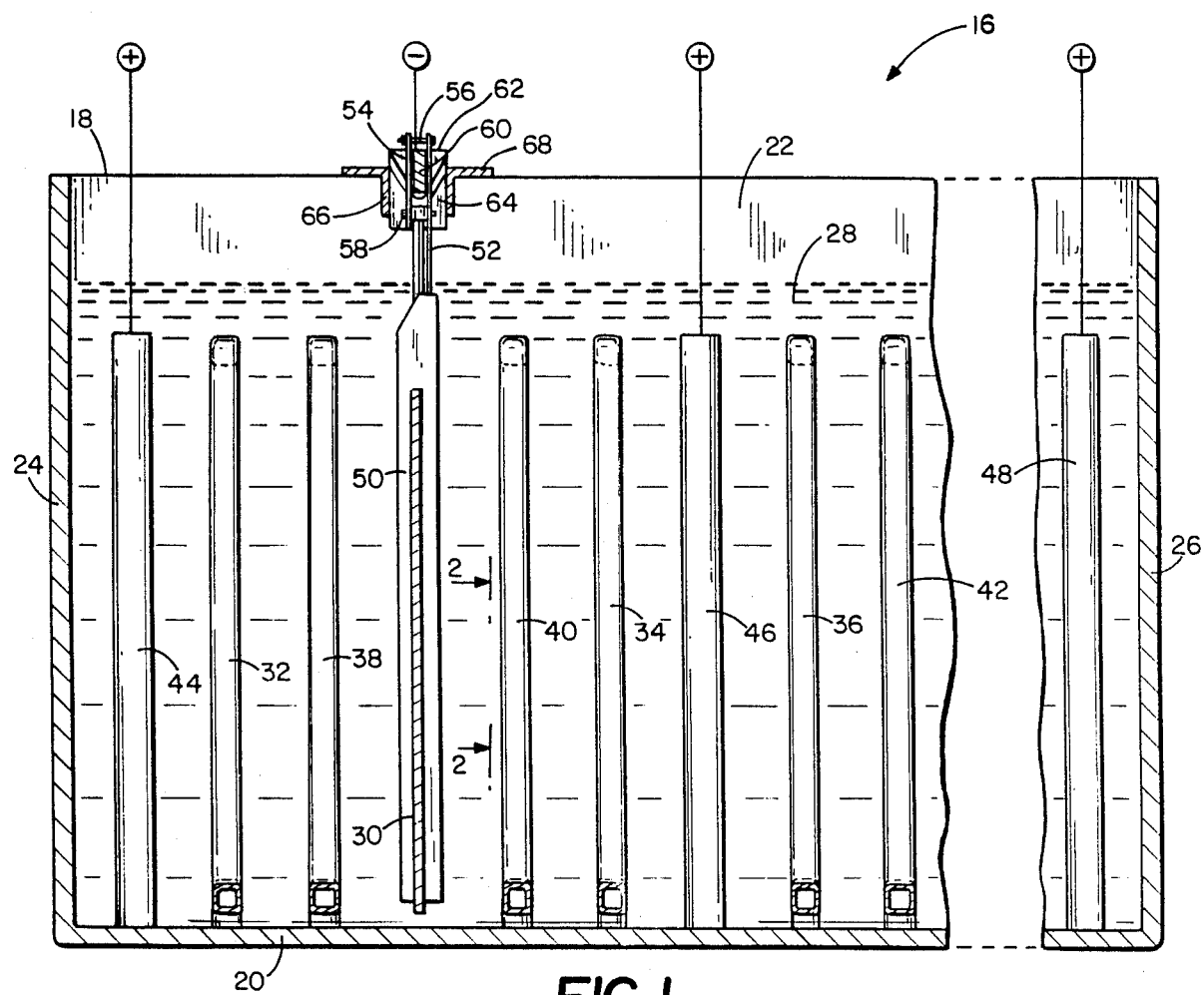
FIG. 1 is a sectional elevation of a plating tank with a plurality of printed circuit boards supported between plating manifolds in accordance with the present invention.

Turning now to the drawings, there is shown in FIG. 1 an electroplating apparatus 16 including a tank 18 including a bottom 20, two opposed side walls, one of which is shown at 22, and two opposed end walls 24 and 26. Tank 18 contains a liquid plating solution, in particular an electrolyte 28.

A plurality of printed circuit boards, one of which is shown at 30, are suspended so as to be totally immersed in the electrolyte. The printed circuit boards are parallel to end walls 24 and 26 and thus appear edgewise. A plurality of vacuum manifolds 32, 34 and 36, and a plurality of pressure manifolds 38, 40, and 42, are supported on bottom 20 and extend upwardly thereof parallel to the printed circuit boards. Also supported from the bottom of tank 18 are a plurality of anodes 44, 46 and 48, each of which can consist of bars, or collections of pellets or similar smaller pieces of the plating metal. The anodes are electrically connected as shown, with the printed circuit boards electrically connected as cathodes.

Each of the vacuum and pressure manifolds includes a plurality of upright pipes, connected by elongate and horizontal piping at the top and bottom. Adjacent vacuum and pressure manifolds are arranged in staggered relation, with each vertical piping section of a pressure manifold situated midway between its pair of next adjacent vacuum manifold piping sections, as viewed from one of the end walls of the tank. The specific structure of the manifolds is known and not particularly germane to the present invention, other than as it relates to the positioning of vacuum and pressure orifices. In brief, the arrangement is such that each printed circuit board is supported between next adjacent pressure manifolds on its opposite sides, flanked by vacuum manifolds, in turn flanked by anodes.

All of the printed circuit boards are supported in similar fashion. Circuit board 30, for example, is releasably and integrally secured by a fixture 50 running along the vertical side edge of the circuit board nearest side wall 22. Fixture 50 includes an upwardly extended plate 52 which, through an opposed plate 54 and a plurality of fasteners 56 and 58, is secured to an elongate horizontally disposed copper bar 60. For a more detailed description of the fixture supporting the circuit board, reference is made to U.S. patent application Ser. No. 332,047, entitled "LOW CLEARANCE ADJUSTABLE PLATING RACK", (Murphy), filed Apr. 3, 1989 and assigned to the assignee of this application.

Although not illustrated in FIG. 1, a corresponding fixture supports printed circuit board 30 along its opposite vertical side edge, and in turn is fastened by corresponding plates and fasteners to copper bar 60. Thus, each printed circuit board, its associated opposed fixtures, plates, fasteners and copper bar, comprise an integral assembly. Also part of this integral assembly are two triangular alignment members, fastened to bar 60 on opposite sides of and at an equal distance from the center of the bar, one of the alignment members being shown at 62.

A mounting member or saddle 64 supports alignment member 62 by gravity, and a similar saddle (not shown) supports the opposite alignment member. The pair of saddles is fixed with respect to tank 18 by a pair of elongate, horizontally disposed angle members 66 and 68 attached to each side of the mounting members, and to the top edges of the side walls of the tank.

As indicated schematically in FIG. 1, anodes 44–48 are electrically connected to a battery or other source of direct current (not illustrated), while the printed circuit boards and their support structure are electrically connected to the opposite terminal of the current source and behave as cathodes. In a manner well known in the electroplating art and therefore not described in detail, the anodes themselves, or alternatively a plating metal contained within anode housings, provides ions of the metal to electrolyte 28 when biased by the current source. The oppositely biased printed circuit boards attract the metal ions from the electrolyte, with such ions deposited onto the printed circuit board and forming a metallic layer or coating over the printed circuit board. As disclosed in U.S. Pat. No. 4,174,261 (Pellegrino) incorporated herein by reference, it has been found that the overall plating rate and the coverage of through-holes and depressions are enhanced by providing nozzle arrays for spraying electrolyte upon parts being plated. Corresponding arrays of vacuum or suction openings also can be provided, for removing electrolyte already sprayed upon such parts. Further, when manifolds of nozzles on opposite sides of a given part are aligned so that the spray nozzles of one manifold are directly aligned with suction openings of the opposite manifold, the arrangement facilitates the plating of throughholes in printed circuit boards. As disclosed in the Pellegrino Patent, manifolds can be in the form of outer containers filled with generally spherical pieces of the metal to be plated.

Figure 2:
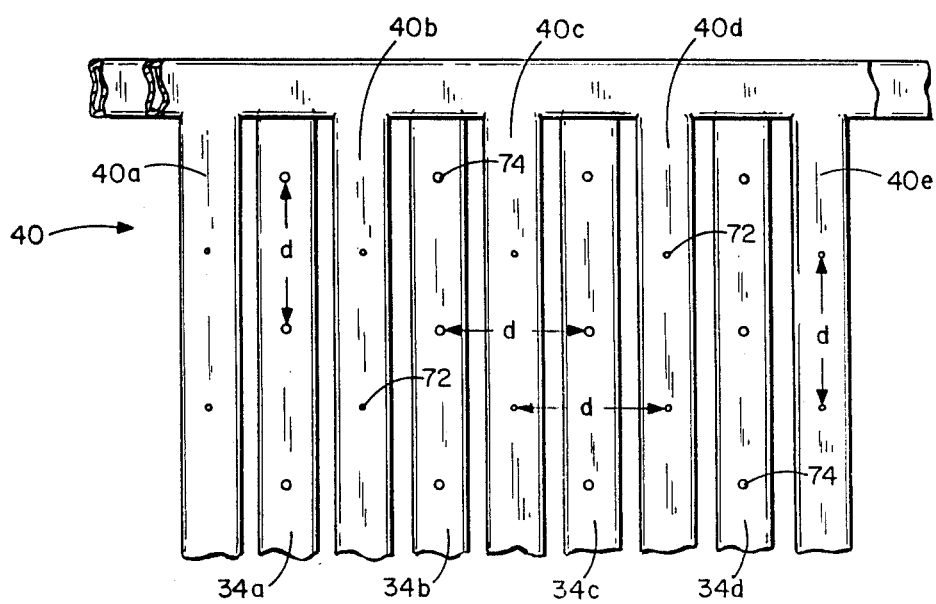
FIG. 2 is a view taken along the line 2—2 in FIG. 1 showing a surface portion of the one of the manifolds.
Figure 3:
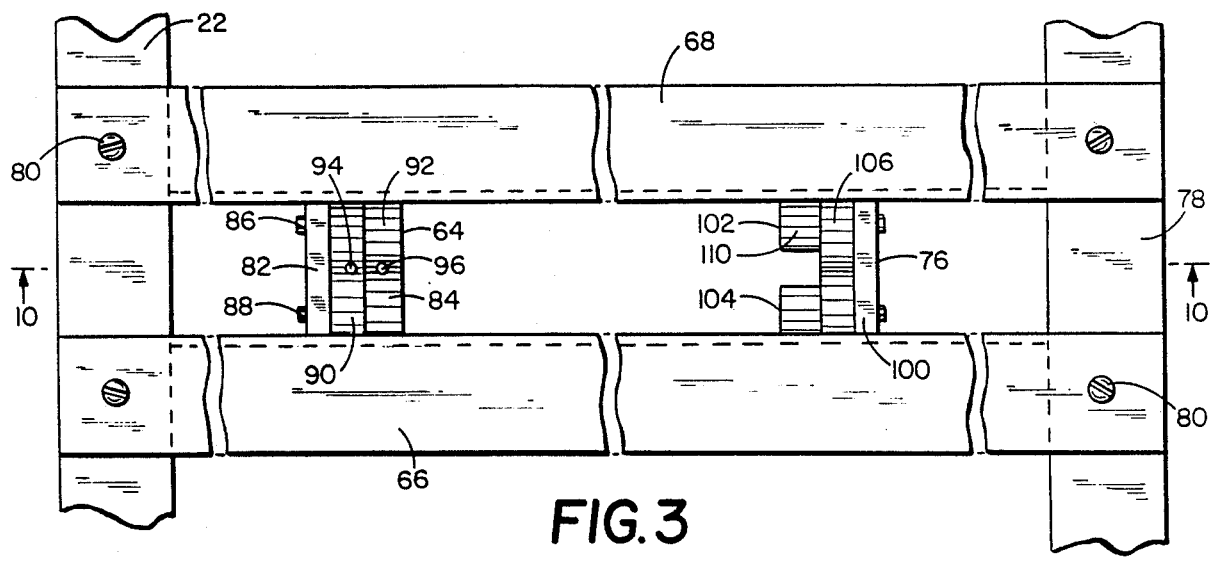
FIG. 3 is a top plan view of a portion of the structure for supporting one of the printed circuit boards.
Figure 4:
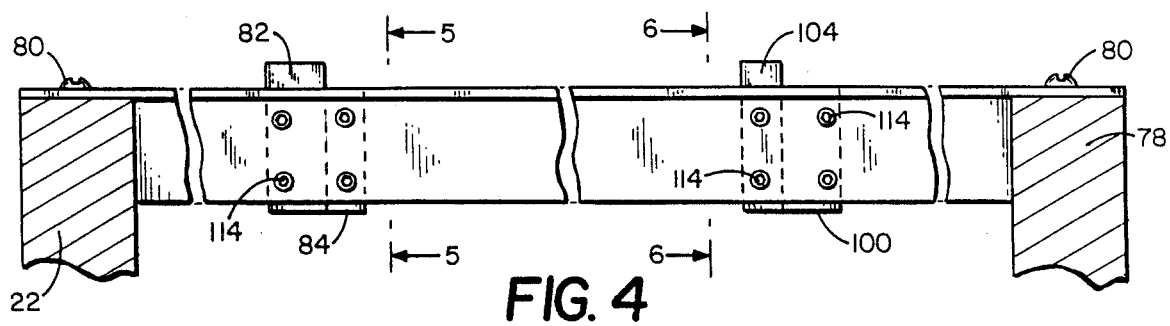
FIG. 4 is a side view of the portion of the support structure shown in FIG. 3.
Figure 5:
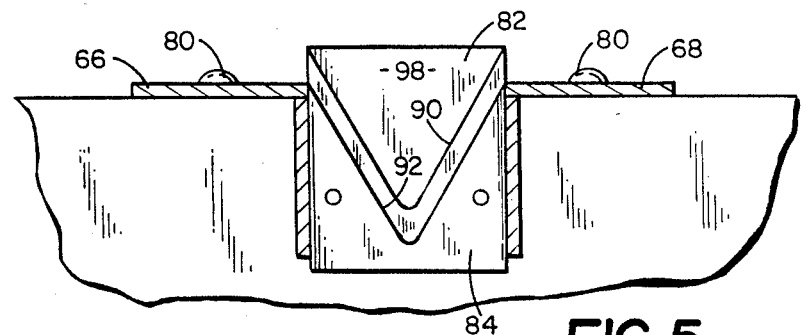
FIG. 5 is a sectional view taken along the line 5—5 in FIG. 4.
Figure 6:
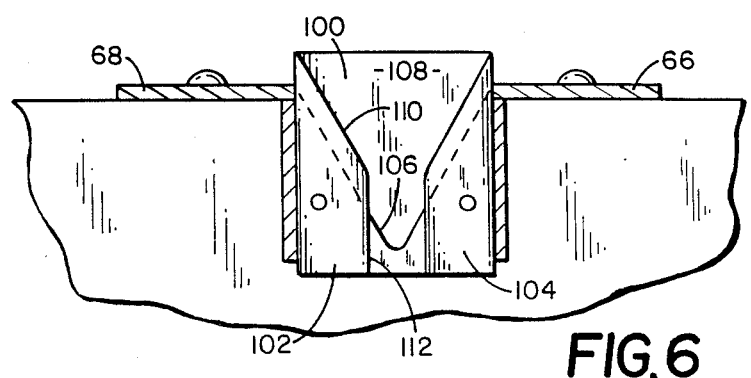
FIG. 6 is a sectional view taken along the line 6—6 in FIG. 4.

FIG. 2 shows portions of pressure manifold 40 and vacuum manifold 34, in particular a row of vertical pressure piping or tubing sections 40a–40e and a row of vertical vacuum piping or tubing sections 34a–34d. The vacuum manifold tubing sections are behind the pressure manifold tubing sections as viewed in the figure, with each of the vacuum tubing sections centrally located between its adjacent pair of pressure manifold tubing sections. A plurality of pressure nozzles or spray orifices 72, formed in pressure manifold tubing sections 40a–e, form an array of spray orifices arranged in vertical columns and horizontal rows. Adjacent columns, as well as adjacent rows, are spaced apart from one another a distance d taken in a plane parallel to end walls 24 and 26. A plurality of suction or vacuum orifices 74 are formed in vacuum manifold tubing sections 34a–d, also in an array of vertical columns and horizontal rows. Each row of vacuum orifices 74 is positioned centrally between a pair of adjacent rows of spray orifices 72, and each vertical column of vacuum orifices is similarly positioned between a pair of adjacent columns of spray orifices. Accordingly, adjacent vacuum orifice rows and columns are spaced apart from one another the same distance d, with each row or column of vacuum orifices offset from an adjacent row or column of spray orifices by the distance d/2. While affording the advantages discussed above, the provision of orifice arrays, alone, fails to provide the uniform thickness required in certain printed circuit boards. In the past, a mounting means capable of oscillating the circuit board during plating was utilized to enhance uniformity. The present invention is directed to achieving greater uniformity without the need for complex and expensive oscillating support systems for the circuit boards.

To this end, FIGS. 3–6 show saddle 64 and its corresponding or opposite saddle 76, it being understood that substantially identical pairs of mounting saddles are provided in connection with each of the remaining printed circuit boards. The saddles are supported by angle members 66 and 68, which rest upon and are secured to the top edges of side wall 22 and an opposite side wall 78 by means of screws 80.

Each of the saddles consists of a pair of mounting plates held together by horizontally directed fasteners. In particular, saddle 64 includes an outer plate 82 and an inner plate 84 secured by fasteners at 86 and 88. Outer and inner plates 82 and 84 have upwardly directed, substantially V-shaped profiles to provide mounting surfaces respectively at 90 and 92, vertically separated from one another (FIG. 5) by a distance d/2, i.e. the distance between each row of spray orifices and its next adjacent row of vacuum orifices. Saddle 76 further includes a pair of pins 94 and 96, each pin extended upwardly from the bottom or base of its associated mounting surface and thus centered on its associated plate. The horizontal distance between pins 94 and 96 (FIG. 3) is equal to d/2, the distance between each column of pressure or spray orifices and its adjacent column of vacuum orifices. The outermost portion of outer plate 82 is not cut away, thereby forming a flat and vertical plate surface 98 of saddle 64.

Saddle 76 consists of an outer plate 100 and two opposed inner plate segments 102 and 104 secured by fasteners 106 and 108, respectively. The inner portion of outer plate 100 is cut away to provide an upwardly facing, V-shaped mounting surface 106, with the outer portion, not similarly cut away, thereby providing a vertical plate surface 108. Inner plate segments 102 and 104 have opposed inclined top edges which together provide a mounting surface 110 vertically separated from mounting surface 106 by the distance d/2. Plate segments 102 and 104 when mounted to outer plate 100 are spaced apart from one another to provide a gap 112 which accommodates copper bar 60 as later explained.

Saddles 64 and 76 are removably fixed to angle members 66 and 68 by fasteners 114, which can be cap screws. The saddles are thus integral with the angle members, and further are spaced apart from one another a distance corresponding to the length of copper bar 60. More particularly, plate surfaces 98 and 108 of the respective saddles are spaced apart from one another a distance greater than the bar length by the distance d/2. Accordingly, these surfaces can provide a means for accurately positioning the copper bar in addition to or in lieu of pins 94 and 96.

As seen from FIG. 7, alignment member 62 and an opposed alignment member 116 are mounted at opposite ends of copper bar 60. As seen in FIG. 8, alignment member 62 includes a pair of triangular alignment plates 118 and 120 secured to opposite sides of copper bar 60 by a pair of threaded fasteners 122 and 124. The opposite and inclined surfaces of the respective alignment plates combine to provide a downwardly directed, generally V-shaped guide surface 126 shaped to form a nesting engagement with any one of mounting surfaces 90, 92, 106 and 110. Alignment member 116 is similarly constructed and includes opposed triangular alignment plates 128 and 130 forming a guide surface 131.

At the center of bar 60 is a handle 132, fastened to the bar by a pair of cap screws 134 and nuts 136. A cable or chain may be secured to handle 132 (e.g. by a hook) for convenient lifting of particularly bulky or heavy printed circuit boards. Vertical alignment apertures 138 and 140 are provided at opposite ends of copper bar 60, each having a diameter corresponding to the diameter of pins 94 and 96 to facilitate alternative alignment of either end of the copper bar with respect to saddle 64. It is to be recognized that the remaining assemblies of a copper bar, alignment plates and handle associated with the remaining printed circuit boards, are substantially identical to that just described.

FIG. 10 illustrates the support of copper bar 60 with respect to tank 18, through the nesting engagement of alignment members 62 and 116 with saddles 64 and 76, respectively. Guide surfaces 126 and 131 are contiguous with mounting surfaces 90 and 110, respectively, with aperture 138 accommodating pin 94. It is to be recognized that bar 60 alternatively can be supported with guide surfaces 126 and 131 contiguous with mounting surfaces 92 and 106 and with aperture 138 accommodating pin 96, in which case copper bar 60 is offset to the right and downwardly as viewed in FIG. 10, in both cases by the distance d/2. Gap 112 between mounting plate segments 112 and 114 is provided to accommodate bar 60 in this offset position.

The alignment members and saddles cooperate to facilitate a highly uniform coating of printed circuit boards 30–36. For a convenient description of operation, spray orifices 72 can be considered to provide electrolyte to their adjacent printed circuit boards in longitudinal streams or jets. Then, for example, plating proceeds for a designated time with copper bar positioned as illustrated in FIG. 10. Following this initial period, bar 60 is repositioned to nest alignment members 62 and 116 into plates 84 and 100, respectively. This provides an offset in the printed circuit board by the distance d/2 in two transverse directions, i.e. downwardly and to the right as viewed in FIG. 10. Consequently, points or areas of the printed circuit board formerly aligned with one of spray orifices 72, become aligned with one of vacuum orifices 74, and plating proceeds to completion, again for the designated time.

To counter any slight variation between manifolds on opposite sides of a particular printed circuit board, the following plating cycle may be employed. A first plating proceeds for a designated time with bar 60 supported as illustrated in FIG. 10. A second plating stage occurs after a repositioning of the bar as described above. Prior to a third stage of the plating process, again for the designated amount of time, the assembly including the copper bar and printed circuit board is lifted vertically at handle 132 and rotated 180° about a vertical axis, then repositioned into saddles 64 and 76 in the offset position. Finally, bar 60 is shifted upwardly and to the right as illustrated in FIG. 10 for the last stage of plating, again for the designated amount of time.

Thus, in accordance with the present invention, printed circuit boards may be coated by an electroplating process in which properly aligned arrays of pressure nozzles and vacuum orifices assure adequate plating of through-holes, yet in a manner to provide a metallized layer of uniform thickness without an oscillating means to support the printed circuit boards. The V-shaped profile of the alignment members and saddles, while not essential for achieving the required nesting engagement, is particularly advantageous in providing a rapid, positive and accurate alignment of the printed circuit board with respect to the manifolds and holding tank. While the present embodiment contemplates electroplating with totally submerged manifolds and printed circuit boards, it can be appreciated that the invention is suited, as well, for a plating process as disclosed in the aforementioned Pellegrino Patent in which the plated parts and manifolds are above the electrolyte level, and also for an electroless plating process. In all of the above applications, uniform plating is facilitated by a precise, repeatable displacement of the printed circuit board.

What is claimed is:

1. A system for plating a printed circuit board over a substantially planar first surface thereof, including a plating solution supply means adjacent said printed circuit board for directing a liquid plating solution onto said planar first surface in the form of a plurality of parallel and spaced apart longitudinal streams or jets, said jets arranged in rows and columns extended in first and second transverse directions, wherein adjacent ones of said columns and rows are transversely spaced apart from one another a selected amount, wherein the improvement comprises:

a mounting means for repeatedly and removably securing said printed circuit board with respect to said plating solution supply means at a predetermined longitudinal separation from said supply means, and further for selectively guiding said printed circuit board into and maintaining said printed circuit board removably in alternative first and second positions offset from one another by one-half of said selected amount in said first and second transverse directions.

2. The system of claim 1 wherein:

said mounting means includes an elongate, rigid transversely directed bar, a means for suspending said printed circuit board from said bar in fixed relation thereto, and first and second alignment means integral with said bar and disposed at opposite ends thereof, said first and second alignment means having respective first and second generally downwardly facing and inclined guide surfaces; and first and second mounting members fixed with respect to said plating solution supply means and transversely spaced apart from one another a distance corresponding to the length of said bar, said first mounting member having first and second generally upwardly facing and inclined mounting surfaces and said second mounting member having generally upwardly facing and inclined third and fourth mounting surfaces, each of said mounting surfaces conforming to the shape of at least one of said guide surfaces for nesting engagement therewith;

wherein said second and fourth mounting surfaces are offset respectively from said first and third support surfaces by one-half of said selected amount in said first and second transverse directions;

said first and third mounting surfaces, and alternatively said second and fourth mounting surfaces, supporting said bar through gravity by virtue of said nesting engagement with said first and second guide surfaces, respectively.

3. The system of claim 2 wherein:

said guide surfaces and said mounting surfaces are V-shaped and substantially identical.

4. The system of claim 3 wherein:

said alignment means have a vertical dimension substantially equal to a vertical dimension of said bar, and wherein a portion of said second mounting member defining the third mounting surface is cut away to provide clearance for said bar when said second and fourth mounting surfaces are in said nesting engagement with said first and second guide surfaces, respectively.

5. The system of claim 3 further including:

a vertically disposed alignment pin extended upwardly of at least one of said first and second mounting surfaces, and first and second vertically disposed apertures in the bottom of said bar proximate opposite ends thereof, said apertures conforming in size and shape to each of said pins whereby each pin, when confined in one of said openings, tends to selectively align said bar with respect to said mounting members.

6. The system of claim 5 further including:

a means for supporting said bar and connected to the center of said bar, for lifting said bar away from said plating solution supply means to permit rotation of said bar and said printed circuit board about a vertical axis.

7. The system of claim 2 wherein:

said plating solution supply means includes a plurality of vacuum sources arranged interstitially of said columns and rows of said longitudinal streams, for drawing said solution longitudinally away from said planar surface.

8. The system of claim 7 wherein:

said plating solution supply means includes a first pressure manifold means longitudinally spaced apart from said plating surface, and a multiplicity of spray orifices in said first pressure manifold means for allowing passage of said plating solution from within said manifold through said spray orifices and toward said plating surface in the form of said jets, and wherein said vacuum sources include a first vacuum manifold means longitudinally spaced apart from said plating surface and a multiplicity of vacuum orifices in said first vacuum manifold means and arranged in vacuum columns and vacuum rows, said vacuum columns and vacuum rows positioned centrally between adjacent ones of said rows and columns of said longitudinal streams.

9. The system of claim 8 further including:

a second pressure manifold means substantially similar to said first pressure manifold means and disposed on the opposite side of said printed circuit board and longitudinally spaced apart from a second planar surface opposite said first surface, each of said spray orifices of said second pressure manifold means aligned with a corresponding one of said vacuum orifices of said first vacuum manifold means.

10. The apparatus of claim 2 further including:

an enclosure for containing said plating solution, said printed circuit board and said plating solution supply means being immersed in said plating solution.

11. The system of claim 10 wherein:

said solution is an electrolyte, and said elongate bar is constructed of an electrically conductive material.

12. A process for plating an article over a substantially planar first surface thereof, including the steps of:

fixing an article to be plated to a guide means having a downwardly facing guide surface area integral with the article;

providing a mounting means having first and second upwardly facing mounting surface areas with each mounting surface area conforming to said guide surface area, for removably supporting said article and guide means alternatively in first and second positions offset from one another by first and second selected amounts in respective first and second directions parallel to a substantially planar first plating surface of said article, with said guide surface areas alternatively contiguous with said first and second mounting surface areas for respectively determining said first and second positions;

providing a first plating solution supply means integral with said mounting means for directing a liquid plating solution in the form of a first plurality of spaced apart streams or jets toward said first plating surface and perpendicular thereto when said first plating surface is so supported in either of said first and second positions;

so supporting said article in said first position while so supplying said plating solution for a first predetermined time; and so supporting said article in said second position while so supplying said plating solution for a second predetermined time.

13. The process of claim 12 wherein said article further includes a substantially planar second surface parallel and opposed to said first plating surfaces, said article is supported with said plating surfaces vertically disposed, and said guide surface area and mounting surface areas are substantially symmetrical about a plane through said article and parallel to said plating surfaces; and wherein said process further comprises the steps of:

rotating said article and guide means to angularly displace them 180° about a vertical axis, and then so supporting said article with said guide surface area contiguous with said first mounting surface area while so supplying said plating solution for a third predetermined time; and with said article so angularly displaced so supporting the article with said guide surface area contiguous with said second mounting surface area while so supplying plating solution for a fourth predetermined time.

14. The process of claim 13 wherein:

said first, second, third and fourth predetermined times are substantially the same.

15. The process of claim 13 including the step of:

providing a second plating solution supply means integral with said mounting means and on the opposite side of said article from said first supply means, for directing said liquid plating solution in the form of a second plurality of spaced apart streams or jets directed toward said article and perpendicular to said plating surfaces, and supplying plating solution from said second supply means simultaneously with supplying plating solution from said first supply means.

16. The process of claim 15 wherein:

said jets are arranged in rows and columns extended respectively in said first and second directions, with adjacent ones of said rows and columns spaced apart from one another by twice said first and second selected amounts, respectively, wherein said first and second plating solution supply means further include respective pluralities of vacuum sources, each arranged interstitially of its associated ones of columns and rows, for drawing the plating solution away from said article, and wherein said article is a printed circuit board having a multiplicity of through-holes spaced apart from one another by twice said selected distance in said first and second directions, said through-holes being perpendicular to said plating surfaces; and wherein said process includes the further step of positioning said first and second supply means with respect to one another such that the jets of each of said supply means are aligned with the vacuum sources of the other supply means.

* * * * *